(12) United States Patent
Guyaux et al.

(10) Patent No.: US 11,685,988 B2
(45) Date of Patent: Jun. 27, 2023

(54) EVAPORATION CELL FOR VACUUM EVAPORATION CHAMBER AND ASSOCIATED EVAPORATION METHOD

(71) Applicant: RIBER, Bezons (FR)

(72) Inventors: Jean-Louis Guyaux, La Vernelle (FR); Franck Stemmelen, Vaureal (FR); Youri Rousseau, Maisons Laffitte (FR)

(73) Assignee: RIBER, Bezons (FR)

( * ) Notice: Subject to any disclaimer, the term of this patent is extended or adjusted under 35 U.S.C. 154(b) by 0 days.

(21) Appl. No.: 17/070,246

(22) Filed: Oct. 14, 2020

(65) Prior Publication Data

US 2021/0115551 A1 Apr. 22, 2021

(30) Foreign Application Priority Data

Oct. 17, 2019 (FR) ...................................... 19 11628

(51) Int. Cl.
*C23C 14/24* (2006.01)
*C23C 14/26* (2006.01)
*C23C 14/06* (2006.01)

(52) U.S. Cl.
CPC ........ *C23C 14/243* (2013.01); *C23C 14/0694* (2013.01); *C23C 14/24* (2013.01)

(58) Field of Classification Search
CPC ................ C23C 14/243; C23C 14/246; C23C 14/24–325
See application file for complete search history.

(56) References Cited

U.S. PATENT DOCUMENTS

| 5,104,695 A | 4/1992 | Greer et al. |
| 2005/0034671 A1 | 2/2005 | Ohara |
| 2006/0288940 A1* | 12/2006 | Yi .......................... C23C 14/12 118/726 |

(Continued)

FOREIGN PATENT DOCUMENTS

| EP | 1 505 167 | 2/2005 |
| JP | H03177563 | 8/1991 |

(Continued)

OTHER PUBLICATIONS

English translation of JP 2013-104117 (Year: 2022).*
Search Report and Written Opinion for FR1911628, dated Jul. 16, 2020, 10 pages.

*Primary Examiner* — Aiden Lee
(74) *Attorney, Agent, or Firm* — Nixon & Vanderhye

(57) ABSTRACT

The invention relates to an evaporation cell (1) for vacuum evaporation chamber, the evaporation cell (1) comprising a crucible (5), the crucible (5) being adapted to receive a solid or liquid material to be sublimated or evaporated, heating means (3) to heat the material in the crucible, a nozzle (6) placed at an open end of the crucible (5), the nozzle (6) comprising a frustoconical portion (61) having an opening (60) adapted for the passage of a flow of evaporated or sublimated material towards the vacuum evaporation chamber, and a cover (7) placed on the nozzle (6), the cover (7) having an opening (70) arranged about the frustoconical portion (61) of the nozzle (6). According to the invention, the cover (7) has at least one frustoconical portion (71, 72, 73) arranged about the frustoconical portion (61) of the nozzle (6), the cover (7) forming a thermal barrier between the crucible (5) and the vacuum evaporation chamber.

7 Claims, 2 Drawing Sheets

(56) References Cited

U.S. PATENT DOCUMENTS

2007/0074654 A1\* 4/2007 Lee ...................... C23C 14/243
                                                          117/217
2010/0031878 A1   2/2010 Priddy et al.
2010/0043710 A1   2/2010 Min et al.

FOREIGN PATENT DOCUMENTS

JP     2013-104117      5/2013
KR     10-2013-0031446  3/2013

\* cited by examiner

EVAPORATION CELL FOR VACUUM EVAPORATION CHAMBER AND ASSOCIATED EVAPORATION METHOD

This application claims priority to FR Patent Application No. 19 11628 filed 17 Oct. 2019, the entire contents of which is hereby incorporated by reference.

TECHNICAL FIELD

The present invention generally relates to the field of equipment for vacuum deposition of thin-film materials.

It more particularly relates to the methods and devices for vapour deposition of material on a substrate.

More particularly, the present invention applies to the thin-film deposition of inorganic or organic materials formed from metal halide, metal oxide and/or metal chalcogenide.

PRIOR ART

Prior art documents US 2007/074654 and U.S. Pat. No. 5,104,695 disclose methods and devices for the vapour deposition of material on a substrate. Generally, the deposition of material is made in a vacuum chamber comprising a heating means, a vacuum pump and an effusion cell, also called evaporation cell, in which is placed the source material to be evaporated. The source material to be evaporated is heated at a temperature higher than 150° C. and evaporates within the effusion cell. In practice, the effusion cell has at least one opening for the passage of the vapour-phase material towards the substrate. Hence, in contact with the substrate, the vapour-phase material condenses to deposit a thin layer of solid material. That way, it is possible to deposit a layer of material or to superimpose successively several thicknesses of thin layers of material.

The effusion cells involved in the evaporation methods intended to deposit a film of material on a substrate comprise several elements, including a crucible and a heating means. The heating means are generally arranged about the crucible. The crucible generally has an upper open end and a lower closed bottom, in which is deposited the source material. The upper open end of the crucible allows the passage of the vapour-phase evaporated material towards the substrate. Often, an insert having an opening of predetermined size is placed on the upper open end of the crucible. The insert has for main function to control the dispersion of the flow of evaporated material at the exit of the effusion cell. This insert also makes it possible, for example, to limit the passage of projections of solid and/or liquid materials generated during the evaporation of the source material on the substrate. These projections of material generate non-uniformities or defects in the film(s) of deposited material. The insert also allows improving the reproducibility of the thickness of a layer during its formation on a substrate.

However, the presence of an opening on the insert causes a high loss of heat at the upper end of the crucible. Sometimes, a phenomenon of condensation on the insert is observed, which may lead to a clogging of the insert opening. The clogging of the insert opening makes the flow of material deposition instable during the process of material deposition on a substrate. This phenomenon of material condensation on the insert is all the more accelerated that the temperature of evaporation or sublimation of the source material is low, in particular for a temperature lower than or equal to 600° C. This phenomenon depends on the nature of the evaporated material.

In the manufacturing of organic light-emitting diode (OLED) display screens, different materials are used, in particular metal halides, metal oxides and/or metal chalcogenide.

In the case of lithium fluoride deposition, for example for the manufacturing of large OLED display screens, the temperature of the crucible is moderated, of the order of 800° C. to 900° C. The speed of evaporation of the lithium fluoride is very low, of the order of 1 to 50 g/h. The methods of lithium fluoride deposition may be very long, of several hours, or even several tens of hours. A partial condensation of the lithium fluoride material on the insert cover is observed. This condensation about the opening of the insert modifies the dispersion of the flow of gaseous material towards the substrate as a function of time and may lead to a clogging of the insert opening. This condensation of material about the insert opening makes it very difficult to maintain a constant speed of deposition during a deposition or from a deposition on a substrate to a deposition on another substrate and is detrimental to the homogeneity of the deposited layer. This phenomenon makes the organic light-emitting diode (OLED) display screen manufacturing method very unpredictable.

It is hence necessary to develop an evaporation device and method making it possible to avoid the problems of insert opening clogging, in particular for a deposition of metal halide, metal oxide and/or metal chalcogenide deposits, and especially for a deposition of lithium fluoride.

One of the objects of the invention it to deposit a thin layer of a material chosen among the metal halides, the metal oxides and/of the metal chalcogenides, whose vapour pressure is comprised between 10 mbar and 1 mbar, at a temperature comprised between 700° C. and 1000° C.

EXPOSURE OF THE INVENTION

To that end, the invention proposes an evaporation cell for vacuum evaporation chamber, the evaporation cell comprising a crucible, the crucible being adapted to receive a solid or liquid material to be sublimated or evaporated, heating means to heat the material in the crucible, a nozzle placed at an open end of the crucible, the nozzle comprising a frustoconical portion having an opening adapted for the passage of a flow of evaporated or sublimated material towards the vacuum evaporation chamber, and a cover placed on the nozzle, the cover having an opening arranged about the frustoconical portion of the nozzle.

According to the invention, the cover has at least one frustoconical portion arranged about the frustoconical portion of the nozzle, the cover forming a thermal barrier between the crucible and the vacuum evaporation chamber.

According to a particular and advantageous aspect, the frustoconical portion of the cover and the frustoconical portion of the nozzle having a same apex angle and a same axis are arranged at a mutual distance comprised between a few tenths of millimetres and a few millimetres.

According to one embodiment, at least one frustoconical portion of the cover comprises several frustoconical cones of same apex angle and same axis, said frustoconical cones being fitted into each other about the frustoconical portion of the nozzle.

Advantageously, two adjacent cones among said frustoconical cones have a contact surface area smaller than or equal to 5% of their respective surface area.

According to one embodiment, the cover is formed from a metal sheet.

Advantageously, the cover covers the open end of the crucible.

According to a particular and advantageous embodiment, the nozzle includes a cylindrical wall and two bottom plates, the cylindrical wall connecting the two bottom plates to the frustoconical portion of the nozzle, the cylindrical wall including openings directed radially and the two bottom plates each comprising at least one opening, said at least one opening of the two bottom plates being arranged in zig zag.

According to a particular and advantageous aspect, the heating means comprise a first heating area arranged about a lower portion of the crucible and a second heating area arranged about the nozzle.

In an exemplary embodiment, the material to be sublimated or evaporated is chosen among a metal halide, a metal oxide and a metal chalcogenide.

The invention also relates to a method of lithium fluoride evaporation comprising the following steps: heating lithium fluoride in a crucible at a temperature higher than a temperature of evaporation of the lithium fluoride at a given pressure so as to form a flow of gaseous lithium fluoride, filtering and directing the flow of gaseous lithium fluoride by means of a nozzle towards a vacuum evaporation chamber, the nozzle being arranged at a mouth of the crucible, the nozzle having a frustoconical portion and an opening, and thermally insulating the nozzle with respect to the evaporation chamber by means of a cover arranged about the opening of the nozzle, the cover having at least one frustoconical portion arranged about the frustoconical portion of nozzle.

Of course, the different features, variants and embodiments of the invention can be associated with each other according to various combinations, insofar as they are not mutually incompatible or exclusive.

SHORT DESCRIPTION OF THE DRAWINGS

Moreover, various other features of the invention emerge from the appended description made with reference to the drawings that illustrate non-limitative embodiments of the invention, and wherein.

It is to be noted that, on these figures, the structural and/or functional elements common to the different variants may have the same references.

DETAILED DESCRIPTION

An effusion cell (or evaporation cell, also called evaporation source in the present document) is used as a source of material for thin-film depositions in a vacuum chamber.

Figure 1:
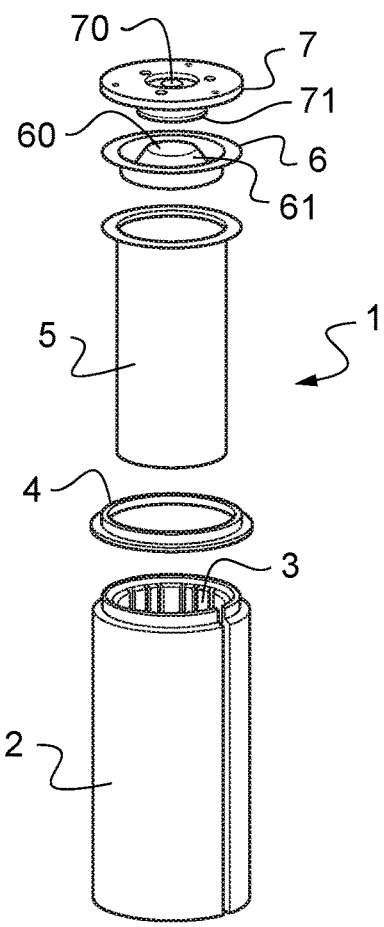
FIG. 1 is an exploded view of an evaporation cell according to one embodiment.

FIG. 1 schematically shows an exploded view of an evaporation source 1 according to one embodiment of the present disclosure. The evaporation source 1 includes a oven 2, the oven 2 comprising at least one heating element 3, a crucible 5, a nozzle 6, a cover 7 and potentially a washer 4.

The oven provides the energy, as heat, required for the evaporation of the material introduced into the crucible. The oven 2 is generally cylindrical in shape. The oven 2 may be manufactured from a material chosen among tantalum, molybdenum, tungsten, graphite, boron nitride, alumina and/or stainless steel. In the example illustrated, the oven 2 is open at its lower end for the passage of electric wires and open at its upper end for the insertion into and extraction from the crucible 5.

The washer 4 is an optional element that serves to centre the crucible 5 in the oven 2.

The crucible 5 is generally cylindrical in shape. The crucible 5 comprises an open end and a closed bottom. In operation, the open end of the crucible 5 is directed upward and the bottom is placed at the bottom of the evaporation source 1. The source material, also called filler, is placed in the bottom of the crucible 5. The filler is generally deposited into the crucible 5 in solid or liquid form. After heating, according to the material and the heating temperature, the filler is sublimated or evaporated into vapour phase. Generally, the initial height of the filler corresponds to about one third of the total height of the crucible 5.

The material to be evaporated is placed into the crucible 5. Then, the crucible 5 is inserted into the oven. Advantageously, the crucible 5 is removable to allow the filling and/or the filler change. The filler is for example chosen among the materials having an evaporation temperature comprised between 150° C. and 1500° C. or a sublimation temperature comprised between 150° C. and 1500° C. In the case of lithium fluoride, the heating temperature is comprised between 800° C. and 900° C.

In an exemplary embodiment, the heating means 3 heat the crucible 5 over its whole height. In another exemplary embodiment, the heating means 3 are divided into two parts: a first heating area and a second heating area. The first heating area is placed in the lower portion of the evaporation cell, which extends for example from the bottom to the two-thirds of the effusion cell height. Advantageously, the second heating area is placed in the upper portion of the effusion cell, for example in the upper third of the effusion cell 1 up to the open end of the crucible. Such heating means allow adjusting independently the heating temperature in the bottom of the crucible and about the nozzle 6.

The heating means can for example comprise one or several heating resistances, also called filaments or heating elements. Generally, the heating means are arranged about the outer portion of the crucible 5. In FIG. 1, the heating means are arranged inside the oven 2 and at the periphery of the lateral walls of the crucible. The heating temperature range of the crucible is comprised between 150° C. and 1500° C. according to the material of the filler used.

A nozzle 6, also called insert, is placed on the open end of the crucible 5, so as to canalize the flow of evaporated material. Advantageously, the nozzle 6 comprises a frustoconical portion 61, for example of circular cross-section. The frustoconical portion 61 has hence a first open end arranged downward, of diameter slightly smaller than the inner diameter of the crucible 5 and a second end forming an opening 60 arranged upward, of diameter smaller than the diameter of the first end. The frustoconical portion 61 and the opening 60 make it possible to control the flow of material to be deposited on a substrate in an evaporation chamber. The frustoconical portion 61 of the nozzle 6 is defined by geometrical parameters such as an opening angle A with respect to the axis 100 of the cone, a total height H1 and a diameter D1 of the opening 60. The inverted frustoconical nozzle is arranged on the end in the upper portion of the crucible so that the vapours of the material coming from the filler enter through the widest portion and exit through the narrowest mouth of the cone. Generally, the opening angle A is comprised between 0 degree and 60 degrees, the height E1 is comprised between 5 mm and 80 mm, and the opening diameter D1 is comprised between 2 mm and 100 mm. By way of non-limitative example, in FIG. 4, the opening angle A is of 35 degrees, the height E1 is of 21 mm and the opening diameter D1 is of 27 mm. In an exemplary embodiment, the nozzle 6 is made from a sheet. In another exemplary embodiment, the nozzle 6 is machined from a solid material. The nozzle 6 may for example be manufactured from a material chosen among tantalum, molybdenum, titanium, niobium, tungsten, graphite, alumina or boron nitride. The conical shape of the nozzle 6 makes it possible to control the flow of vapour-phase material and hence to control the uniformity of the material deposit on the substrate. The nozzle 6 is adapted to be placed or fastened on the open end of the crucible 5.

Figure 2:
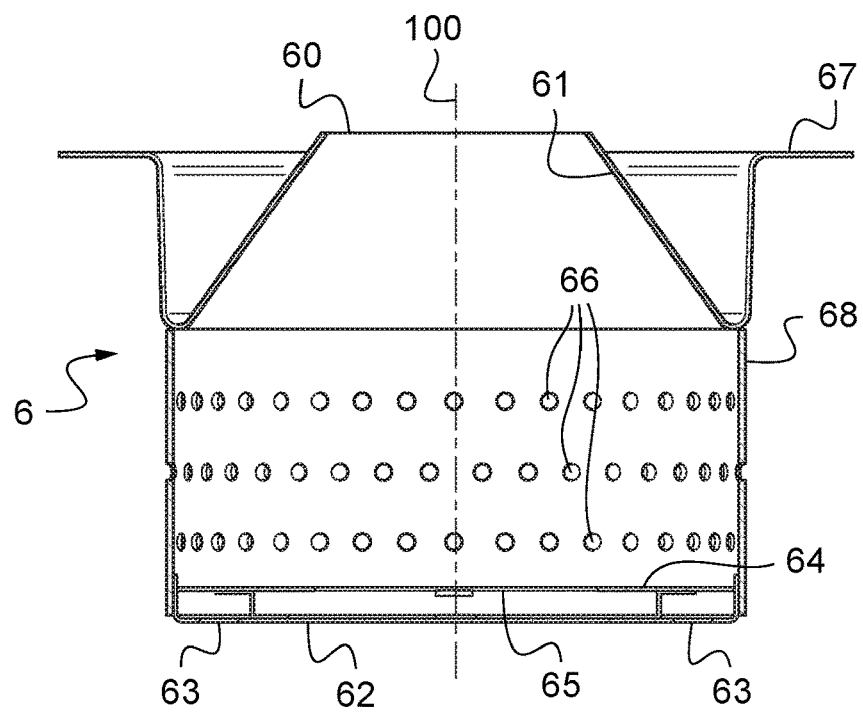
FIG. 2 is a sectional view of a filtering nozzle according to a particular embodiment.

According to a variant illustrated in FIG. 2, the nozzle 6 further comprises the frustoconical portion 61, a lateral grid 68, a first plate 64, also called collimator or restrictor, and a second plate 62, also called impactor. The first plate 64 comprises for example a central opening 65 or several openings. The second plate 62 advantageously comprises several openings 63 arranged in periphery. The openings 63 of the second plate 62 are arranged in zig zag with respect to the central opening 65 or to the openings of the first plate 64. The size of the opening(s) of the first plate 64 is such that their total surface area is greater than or equal to the surface area of the openings 63 of the impactor 62.

The lateral grid 68 is for example formed from a sheet and, possible, a network of drilled holes 66. As a variant, the grid 68 may be manufactured from a sheet, for example perforated or expanded or from a wire mesh, for example weaved or welded. The material used to manufacture the grid 68 is preferably chosen among tantalum (Ta), pyrolytic boron nitride (pBN), molybdenum (Mo), titanium (Ti), niobium (Nb), tungsten (W), alumina ($Al_2O_3$) and graphite.

Figure 4:
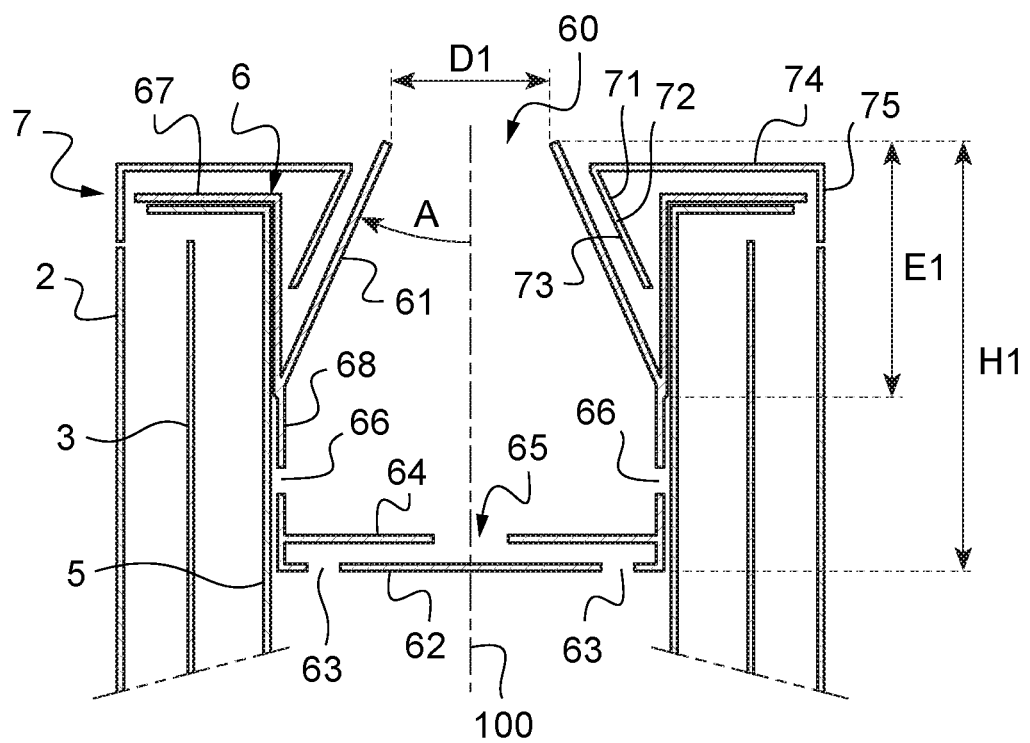
FIG. 4 is a schematic partial sectional view of an evaporation cell according to one embodiment.

On the one hand, the frustoconical portion 61 of the nozzle 6 is welded to the lateral grid 68. On the other hand, the first plate 64 and the second plate 62 are also welded to the lateral grid 68. That way, the flow of evaporated material coming from the crucible is forced to pass through the impactor 62, then through the collimator 64, or through the lateral grid. The assembly of the frustoconical portion 61, the lateral grid 68, the collimator 64 and the impactor 62 hence forms a filtering nozzle. The filtering nozzle is introduced into the open end of the crucible as illustrated in FIG. 4. The total height H1 of the filtering nozzle is for example of 80 mm. The height E1 of the frustoconical portion 61 of the nozzle is for example of 21 mm. The filtering nozzle reduces the fluid conductance of the insert. However, the nozzle may be heated to a higher temperature to maintain the value of the flow of evaporated material.

In the case where the heating means comprise two heating areas, the second heating area advantageously extends about the filtering nozzle over the height H1. That way, it is possible to thermally dissociate, on the one hand, the heating of the filler to form the flow of evaporated material and, on the other hand, the heating of the nozzle to avoid any condensation of material at the opening 60.

Figure 3:
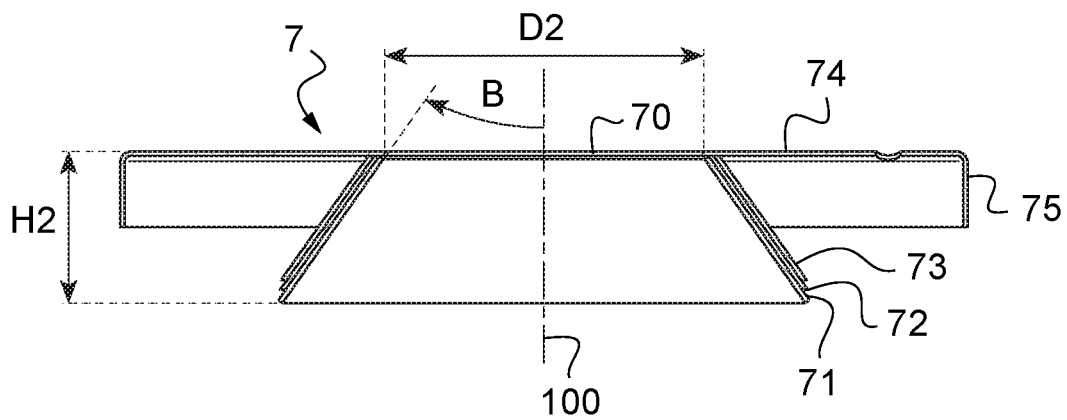
FIG. 3 is a sectional view of a cover according to one embodiment.

According to the present disclosure, the evaporation cell further includes a cover 7. The cover 7 includes a support portion 75 that bears on the mouth of the oven 2 of the cell (see FIG. 4). The cover 7 includes at least one portion of frustoconical shape 71. Particularly advantageously, the cover 7 includes several frustoconical portions 71, 72, 73, as illustrated in FIG. 3. The cover 7 also includes an annular portion 74 arranged transversely to the axis 100 of the cone, which connects the support portion 75 to the frustoconical portion(s) 71, 72, 73. The annular portion 74 of the cover contributes to thermally isolate the nozzle 6 with respect to the evaporation chamber. However, the annular portion 74 receives a flow of heat coming from the oven 2 adapted to maintain the annular portion 74 at a high-enough temperature to re-evaporate the species back-scattered from the evaporation chamber to the cover 7.

Advantageously, the frustoconical portions 71, 72, 73 have a circular cross-section. Advantageously, the portions of frustoconical shape 71, 72, 73 have a same apex angle B and a same axis 100. The portions of frustoconical shape 71, 72, 73 are arranged along the same axis 100, with an axial offset comprised between 0.1 mm and 5 mm so as to provide a space between two adjacent frustoconical portions. Particularly advantageously, the apex angle of the frustoconical portion 71 is identical to the apex angle A of the frustoconical portion 61 of the nozzle 6. When the evaporation cell is operational, the frustoconical portion 71 of the cover 7 is at a distance comprised between 0.1 mm and 10 mm from the frustoconical portion 61 of the nozzle 6. Hence, the frustoconical portion 71 of the cover surrounds a part of the frustoconical portion 61 of the nozzle 6. The frustoconical portion 71 of the cover forms a heat shield between the vacuum evaporation chamber and the nozzle 6. Far more advantageously, the frustoconical portions 71, 72, 73 form a heat shield far more efficient between the vacuum evaporation chamber and the nozzle 6. Generally, the cover 7 is made of tantalum. In an exemplary embodiment, each of the sheets of the frustoconical portions 71, 72, 73 is provided with a mechanical device making it possible to maintain a distance between adjacent frustoconical portions while guaranteeing a minimum of contact between these adjacent conical portions. The mechanical device may be consisted of bosses or recesses formed into the sheets of the frustoconical portions 71, 72, 73. As a variant, the frustoconical portions 71, 72, 73 are maintained remote from each other by means of rivets. The frustoconical portions 71, 72, 73 are for example welded to the annular portion 74 about an opening 70. Advantageously, the opening 70 is circular and of diameter D2. The height H2 of the frustoconical portion(s) 71, 72, 73 is lower than or equal to the height E1 of the frustoconical portion 61 of the nozzle 6.

As illustrated in FIG. 4, the support portion 75 of the cover 7 bears on the mouth of the oven 2. The frustoconical portion(s) 71, 72, 73 of the cover 7 are directed in the same direction as the frustoconical portion 61 of the nozzle 6, and along the same axis 100. The opening 70 of the cover is hence arranged about the frustoconical portion 61 of the nozzle 6. Advantageously, the opening 70 of the cover is arranged at the maximum at the same height as the opening 60. For an optimum result, the opening 70 is located just below the opening 60, for example by 1 mm to 8 mm. The cover 7 and the filtering insert 6 are sized so that, after assembly, the cover 7 has no physical contact with the filtering insert 6. More precisely, the support portion 75 and the annular portion 74 of the cover 7 are sized so as to leave a minimum distance, or mutual distance, comprised between a few tenths of millimetres and a few millimetres, between the cover 7 and the filtering insert 6. In other words, the cover 7 and the filtering insert 6 are mechanically separated or insulated from each other.

The cover 7, consisted of the support portion 75, the annular portion 74 and the portion(s) of frustoconical shape 71, 72, 73 form a heat shield between the frustoconical portion 61 of the nozzle 6 and the vacuum evaporation chamber. Such a cover 7 avoids the losses of heat from the evaporation source to the vacuum evaporation chamber and makes it possible to maintain the frustoconical portion 61 at a high temperature. In the same time, the cover 7 is designed to favour a controlled loss of heat from the oven 2 to the annular portion 74. Indeed, the annular portion 74 faces the vacuum evaporation chamber. This annular portion receives a flow of heat so as to maintain this annular portion 74 at a high-enough temperature to re-evaporate potential deposits of material due to condensation on the evaporation chamber side.

The assembly of the nozzle 6 and the cover 7 makes it possible to avoid the condensation of the materials on the cover 7 and/or on the nozzle 6 during the period of use of the source. This cover 7 makes it possible in particular to avoid a condensation of material by back-scattering from the vacuum evaporation chamber to the cover 7. Moreover, the annular portion 74 of the cover 7 is maintained at a high-enough temperature to allow a re-evaporation of the species possibly back-scattered at the exit of the mouth of the nozzle 6. Finally, the cover 7 makes it possible to maintain the inner surface of the frustoconical portion 61 of the nozzle 6 at a sufficient temperature to avoid the condensation of materials on the latter.

The source of evaporation makes it possible to better control the intensity of the molecular jet generated during the heating of the material in the crucible. A quartz scale can be used to measure the speed of deposition in the evaporation chamber. The quartz scale is positioned so as not to be interposed between the source and the substrate intended to receive the thin-film deposit of material. The quartz scale is positioned so as to detect a part of the molecular jet and to measure the intensity thereof. The quartz scale provides a signal, which may be used to adjust the heating intensity of the cell, through the electric power applied to the filament(s) so as to maintain the intensity of the molecular jet as close as possible to a predefined setpoint. In production phase, such a feedback system makes it possible to maintain a constant film thickness, substrate after substrate, in predetermined limits of the process.

In a first example, a mean speed of evaporation of the order of 8.05 g/h for a duration of 13 h is hence obtained. In a second example, a mean speed of evaporation of the order of 6.8 g/h for a duration of 50 h is obtained. In these two examples, no condensation of material is observed on the cover 7, nor on the impactor 62, nor on the inner wall of the nozzle 6. The measurements via a quartz scale indicate a very good stability (fluctuations lower than ±5%) of the molecular jet all over the 50 h of deposition.

The present disclosure also relates to a method of metal halide, metal oxide or metal chalcogenide evaporation. A metal halide has a chemical formula of the type $MBr_x$, $MI_x$, $MCl_x$, $MF_x$, where M is a metal, and Br, I, Cl, F are respectively bromine, chlorine, iodine and fluorine atoms. A metal oxide has a chemical formula of the type $MO_x$, where M is a metal and O the oxygen atom. A metal chalcogenide has a chemical formula of the type $MSe_x$, $MS_x$, $MTe_x$, where M is a metal and Se, S, Te are respectively the selenium, sulphur and tellurium atoms. These materials generally have a low thermal conductivity and are hence heat insulators.

The materials are used in various fields of the semiconductor industry. In particular, among others, the lithium fluoride (LiF) is used for the production of flat display screens of the OLED type. The lithium fluoride is transparent in thin film. The lithium fluoride is generally used to passivate the electronic devices and/or for an optical function, for example extraction of light.

However, the deposition of lithium fluoride by evaporation presents technical difficulties. The lithium fluoride is a material whose vapour pressure is moderate, typically the evaporation temperatures are comprised between 800 and 900° C. The lithium fluoride is an electrically and thermally insulating material. The lithium fluoride vaporizes in molecular form by congruent evaporation. The evaporation speed is generally comprised between 1 and 50 g/h. The speed of deposition on a substrate is of the order of 0.1 nm/s to 0.5 nm/s. Now, the duration of a method of lithium fluoride evaporation may reach several hours or even several tens of hours. In these conditions, it is generally observed, in the methods of the prior art, that lithium fluoride condensates on the nozzle of an evaporation cell of the prior art, forming a snow, that disturbs the maintenance of a constant speed of deposition and liable to clog the nozzle opening over time. The condensation of the lithium fluoride is all the more fast that the intensity of the molecular jet is high.

By way of non-limitative example, a method of lithium fluoride deposition is described. The method comprises the following steps: heating lithium fluoride in solid form at a temperature generally comprised between 900° C. and 1200° C., higher than a temperature of evaporation of the lithium fluoride at a given pressure, generally comprised between 0.06 mbar and 6 mbar, so as to form a flow of gaseous lithium fluoride; filtering and directing the flow of gaseous lithium fluoride by means of a nozzle 6 having a frustoconical portion 61 and an opening 60 towards a vacuum evaporation chamber, the nozzle 7 having at least one frustoconical portion 71 arranged about the frustoconical portion 61 of the nozzle 6 so as to thermally isolate the nozzle 6 with respect to the evaporation chamber. Particularly advantageously, the method further comprises a step of heating the nozzle 6 and the cover 7 to a sufficient temperature (generally comprised between 900° C. and 1200° C.) to avoid a condensation of materials on the nozzle 6 and on the cover 7.

The deposition method makes it possible to deposit the lithium fluoride on a substrate placed in the vacuum evaporation chamber, with a speed of deposition comprised between 0.1 nm/s and 0.5 nm/s, for a duration comprised between 1 minute and 50 hours, to obtain a deposited film thickness comprised between 0.1 nm and 100 nm.

Of course, various other modifications may be made to the invention within the scope of the appended claims.

The invention claimed is:

1. An evaporation cell for a vacuum evaporation chamber, the evaporation cell comprising:
   a crucible configured to receive a solid or liquid material to be sublimated or evaporated;
   heating resistances configured to heat the material in the crucible;
   a nozzle disposed at an open end of the crucible, the nozzle comprising
      a frustoconical portion having an opening defined for passage of a flow of evaporated or sublimated material towards the vacuum evaporation chamber,
      two bottom plates each comprising at least one opening, the openings of the two bottom plates being disposed in a zig zag form, and
      a cylindrical wall connecting the two bottom plates to the frustoconical portion of the nozzle, a gap being defined between the cylindrical wall and the crucible, the cylindrical wall including radially-directed openings connected to the gap between the cylindrical wall and the crucible; and
   a cover disposed on the nozzle, the cover having an opening disposed about the frustoconical portion of the nozzle, the cover including at least one support portion, at least one frustoconical portion, and at least one annular portion connecting the at least one support portion to the at least one frustoconical portion, the at least one frustoconical portion of the cover extending from the opening of the cover in the at least one annular portion toward a same direction and along a same axis as the frustoconical portion of the nozzle, the at least one frustoconical portion of the cover being disposed about the frustoconical portion of the nozzle, the cover forming a thermal barrier between the crucible and the vacuum evaporation chamber, wherein the nozzle is configured such that the flow of evaporated or sublimated material passes through the first and second bottom plates or through the radially-directed openings of the cylindrical wall, and wherein the heating resistances comprise a first heating area disposed about a lower portion of the crucible, and a second heating area disposed about the nozzle.

2. The evaporation cell according to claim 1, wherein the frustoconical portion of the cover and the frustoconical portion of the nozzle, having a same apex angle and a same axis, are disposed at a mutual distance comprised between a few tenths of millimeters and a few millimeters.

3. The evaporation cell according to claim 1, wherein the at least one frustoconical portion of the cover includes a plurality of frustoconical cones of a same apex angle and a same axis, the plurality of frustoconical cones being fitted into each other about the frustoconical portion of the nozzle.

4. The evaporation cell according to claim 3, wherein two adjacent cones among the plurality of frustoconical cones have a contact surface area smaller than or equal to 5% of their respective surface area.

5. The evaporation cell according to claim 1, wherein the cover is formed from a metal sheet made of tantalum.

6. The evaporation cell according to claim 1, wherein the cover covers the open end of the crucible.

7. The evaporation cell according to claim 1, wherein the material to be sublimated or evaporated is chosen among a metal halide, a metal oxide, and a metal chalcogenide.

* * * * *